United States Patent
Zhao et al.

(10) Patent No.: US 9,656,460 B2
(45) Date of Patent: May 23, 2017

(54) INK JET PRINTING APPARATUS, DISPLAY SUBSTRATE MANUFACTURED BY INK JET PRINTING APPARATUS, AND INK JET PRINTING METHOD

(71) Applicant: BOE TECHNOLOGY GROUP CO., LTD., Beijing (CN)

(72) Inventors: Dejiang Zhao, Beijing (CN); Shinsuke Iguchi, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 14/894,857

(22) PCT Filed: Apr. 8, 2015

(86) PCT No.: PCT/CN2015/076034
§ 371 (c)(1),
(2) Date: Nov. 30, 2015

(87) PCT Pub. No.: WO2016/086563
PCT Pub. Date: Jun. 9, 2016

(65) Prior Publication Data
US 2016/0361931 A1 Dec. 15, 2016

(30) Foreign Application Priority Data
Dec. 1, 2014 (CN) .......................... 2014 1 0720260

(51) Int. Cl.
*B41J 11/00* (2006.01)
*B41J 2/01* (2006.01)
(Continued)

(52) U.S. Cl.
CPC ............. *B41J 2/01* (2013.01); *B41J 11/0015* (2013.01); *H01L 51/0005* (2013.01);
(Continued)

(58) Field of Classification Search
CPC ...... B41J 2/01; B41J 11/0015; B41M 5/0011; H01L 51/0028; H01L 51/56; H01L 51/0005
See application file for complete search history.

(56) References Cited

U.S. PATENT DOCUMENTS

2003/0159651 A1* 8/2003 Sakurada ............. B05B 12/122
118/52
2004/0092128 A1* 5/2004 Grant ................ H01L 21/67253
438/745

FOREIGN PATENT DOCUMENTS

CN         1398390 A      2/2003
CN         1439517 A      9/2003
(Continued)

OTHER PUBLICATIONS

First Office Action regarding Chinese application No. 201410720260.6, dated Aug. 31, 2015. Translation provided by Dragon Intellectual Property Law Firm.
(Continued)

*Primary Examiner* — Manish S Shah
*Assistant Examiner* — Yaovi M Ameh
(74) *Attorney, Agent, or Firm* — Harness, Dickey & Pierce, P.L.C.

(57) ABSTRACT

The disclosure provides an ink jet printing apparatus. The ink jet printing apparatus includes a support base configured to support the to-be-processed substrate; and a solvent adjusting mechanism, configured to supply a dummy region of the to-be-processed substrate on the support base with a first solvent that is same as a solvent in an ink and adjust a solvent atmosphere of the dummy region of the to-be-processed substrate on the support base, to make the solvent atmosphere of the dummy region of the to-be-processed substrate and that of a center region of the to-be-processed substrate reach a predetermined condition. The solvent adjusting mechanism is arranged on the support base.

20 Claims, 2 Drawing Sheets

(51) Int. Cl.
*H01L 51/00* (2006.01)
*H01L 51/56* (2006.01)
*B41M 5/00* (2006.01)

(52) U.S. Cl.
CPC .......... *H01L 51/0028* (2013.01); *H01L 51/56* (2013.01); *B41M 5/0011* (2013.01)

(56) References Cited

FOREIGN PATENT DOCUMENTS

| | | | |
|---|---|---|---|
| CN | 1618609 | A | 5/2005 |
| CN | 1678144 | A | 10/2005 |
| CN | 1693971 | A | 11/2005 |
| CN | 1700044 | A | 11/2005 |
| CN | 101549582 | A | 10/2009 |
| CN | 103241025 | A | 8/2013 |
| CN | 103862862 | A | 6/2014 |
| CN | 104051674 | A | 9/2014 |
| CN | 104260554 | A | 1/2015 |
| CN | 104369541 | A | 2/2015 |
| CN | 204278756 | U | 4/2015 |

OTHER PUBLICATIONS

Written Opinion of the International Searching Authority for international application No. PCT/CN2015/076034.

\* cited by examiner

INK JET PRINTING APPARATUS, DISPLAY SUBSTRATE MANUFACTURED BY INK JET PRINTING APPARATUS, AND INK JET PRINTING METHOD

CROSS-REFERENCE TO RELATED APPLICATIONS

The present application is the U.S. national phase of PCT Application No. PCT/CN2015/076034 filed on Apr. 8, 2015, which claims priority to Chinese Patent Application No. 201410720260.6 filed on Dec. 1, 2014, the disclosures of which are incorporated in their entirety by reference herein.

TECHNICAL FIELD

The present disclosure relates to the field of display manufacturing technology, in particular to an ink jet printing apparatus, a display substrate manufactured by the ink jet printing apparatus, and an ink jet printing method.

BACKGROUND

Organic Light Emitting Diode (OLED) display devices are popular in the market because of their advantages such as bright colors, low power consumption, and small thickness. However, the development of OLED products is restricted due to reasons such as complex manufacturing process of OLED. Currently, the only widely used approach for manufacturing OLED devices is through evaporation. However, manufacturing the OLED devices through evaporation results in a very low utilization ratio of material, and accordingly, the cost of OLED products maintains high and the development of OLED products is influenced and restricted.

In conventional technologies, apparatuses and processes applying ink jet approach to manufacture OLED products are turning more and more mature nowadays and are getting widely used. Nearly no material is wasted when applying the ink jet approach to manufacture OLED products, but the following problem exists. When applying the ink jet approach to manufacture OLED products, the material needs to dissolve in a solvent to perform printing. During the printing process, the solvent in a pixel of a region closer to a periphery of a substrate volatizes more easily. A solvent atmosphere in a dummy region of the substrate differs from that in a center region of the substrate, the solvent in the center region of the substrate volatizes slowly while the solvent in the dummy region of the substrate volatizes quickly; hence, the dummy region of the substrate is apt to generate mura, which adversely influence the display effect.

Currently, in order to solve the problem that the mura is generated in the dummy region of the substrate and the display effect is adversely influenced, a common solution is to enlarge the dummy region of the substrate, but the width of the border increases due to the enlarging of the dummy region.

SUMMARY

(1) Technical Problems to be Solved

The present disclosure intends to provide an ink jet printing apparatus, with which a solvent atmosphere in a dummy region of a substrate is roughly similar to that in a center region of the substrate, thereby alleviating the phenomenon that the solvent in the dummy region of the substrate volatizes quickly and improving the uniformity of a formed film.

(2) Technical Solutions

Technical solutions provided in the present disclosure are given as follows.

According to one aspect of the present disclosure, an ink jet printing apparatus is provided. The ink jet printing apparatus is provided to jet an ink onto a to-be-processed substrate to perform printing.

The ink jet printing apparatus includes:

a support base, configured to support the to-be-processed substrate; and a solvent adjusting mechanism, configured to supply a dummy region of the to-be-processed substrate on the support base with a first solvent that is same as a solvent in the ink and adjust a solvent atmosphere of the dummy region of the to-be-processed substrate on the support base, to make the solvent atmosphere of the dummy region of the to-be-processed substrate and a solvent atmosphere of a center region of the to-be-processed substrate reach a predetermined condition; where the solvent adjusting mechanism is arranged on the support base.

Furthermore, the predetermined condition includes a condition that the solvent atmosphere of the dummy region of the to-be-processed substrate is approximately same as the solvent atmosphere of the center region of the to-be-processed substrate.

Furthermore, the solvent adjusting mechanism includes a first adjusting mechanism, configured to supply the dummy region of the to-be-processed substrate on the support base with the first solvent in the form of gas.

Furthermore, the first adjusting mechanism includes:

a gaseous solvent supplying device configured to supply the first solvent in the form of gas; and a gaseous solvent discharging device configured to guide and discharge the first solvent in the form of gas to the dummy region of the to-be-processed substrate on the support base; where the gaseous solvent discharging device is in communication with the gaseous solvent supplying device and is arranged at a periphery of the support base.

Furthermore, the gaseous solvent supplying device includes:

a liquid supplying device, configured to supply the first solvent in a form of liquid; and a solvent volatizing device, configured to convert the first solvent from liquid to gas, where the solvent volatizing device is in communication with both the liquid supplying device and the gaseous solvent discharging device.

Furthermore, the gaseous solvent supplying device further includes a control device, configured to control a supplying condition of the first solvent in the form of gas. The supplying condition includes a supplying dose of the first solvent in the form of gas.

Furthermore, the control device includes a first control mechanism, configured to control an operating state of the solvent volatizing device to control a dose of the first solvent in the form of gas converted from the first solvent in the form of liquid. The first control mechanism is connected with the solvent volatizing device.

Furthermore, the gaseous solvent discharging device includes:

supplying passages surrounding a periphery of the support base, the supplying passages being in communication with the gaseous solvent supplying device; and multiple gas jetting holes, distributed on the supplying passages and configured to jet the first solvent in the form of gas to the periphery of the support base.

Furthermore, the supplying passages include four pipe segments surrounding the periphery of the support base, gas inlets are provided at ends of each pipe segment, and the gas inlets are arranged at positions corresponding to four corners of the to-be-processed substrate on the support base.

Furthermore, gas flow amounts of gas jetting holes arranged at positions corresponding to four corners of the to-be-processed substrate on the support base are larger than gas flow amounts of gas jetting holes arranged at positions corresponding to other positions of the to-be-processed substrate on the support base other than the four corners.

Furthermore, diameters of gas jetting holes arranged at positions corresponding to four corners of the to-be-processed substrate on the support base are larger than diameters of gas jetting holes arranged at other positions; or quantities or distribution densities of gas jetting holes arranged at positions corresponding to four corners of the to-be-processed substrate on the support base are larger than quantities or distribution densities of gas jetting holes arranged at other positions.

Furthermore, from a position corresponding to one corner of the to-be-processed substrate to a position corresponding to another corner adjacent to the one corner of the to-be-processed substrate, diameters of the gas jetting holes first gradually decrease and then gradually increase; or, from a position corresponding to one corner of the to-be-processed substrate to a position corresponding to another corner adjacent to the one corner of the to-be-processed substrate, quantities of the gas jetting holes first gradually decrease and then gradually increase.

Furthermore, a jetting direction of the first solvent in the form of gas out of the gas jetting holes is substantially perpendicular to a supporting surface of the support base.

Furthermore, a jetting direction of the first solvent in the form of gas out of the gas jetting holes is slant towards a center portion of the support base.

Furthermore, the gaseous solvent discharging device further includes a moving device, configured to move the supplying passages to adjust positions of the gas jetting holes with respect to a supporting surface of the support base.

Furthermore, four gas jet rods are surrounding the periphery of the support base, the gas jet rods are hollowed inside to form the supplying passages, and the gas jetting holes are distributed on the gas jet rods; and the moving device includes a first moving structure, configured to move the gas jet rods in a first direction substantially perpendicular to the supporting surface of the support base, one end of the first moving structure is connected to the gas jet rods, and another end of the first moving structure is connected to the support base.

Furthermore, the first moving structure includes a telescopic rod having one end connected to the gas jet rods and another end connected to the support base.

Furthermore, the telescopic rod is hollowed inside and is in communication with the gas jet rods and the gaseous solvent supplying device.

Furthermore, the telescopic rod is a hydraulic rod.

According to another aspect of the present disclosure, a display substrate, manufactured by any of the foregoing ink jet printing apparatuses, is provided.

According to further another aspect of the present disclosure, an ink jet printing method, for jetting ink onto a to-be-processed substrate to perform a printing, is provided.

The ink jet printing method includes:
supporting the to-be-processed substrate by a support base; and
supplying a dummy region of the to-be-processed substrate on the support base with a first solvent that is same as a solvent in the ink and adjusting a solvent atmosphere of the dummy region of the to-be-processed substrate on the support base, by a solvent adjusting mechanism arranged on the support base, to make the solvent atmosphere of the dummy region of the to-be-processed substrate and a solvent atmosphere of a center region of the to-be-processed substrate reach a predetermined condition.

(3) Beneficial Effects

Advantages of the present disclosure are described as follows.

In the ink jet printing apparatus provided in the present disclosure, with the arrangement of a solvent adjusting mechanism, a solvent (i.e., a first solvent which is same as a solvent in the ink) is supplied to the dummy region of the to-be-processed substrate on the support base. Hence, the solvent atmosphere in the dummy region of the to-be-processed substrate on the support base is adjusted, the solvent atmosphere in the dummy region of the to-be-processed substrate is roughly similar to that in the center region of the to-be-processed substrate, thereby alleviating the phenomenon that the solvent in the dummy region volatizes too quickly, avoiding the generation of mura, and improving the uniformity of a formed film.

BRIEF DESCRIPTION OF THE DRAWINGS

For clarifying technical solutions according to embodiments of the present disclosure or conventional technologies, drawings to be used in descriptions of the embodiments are briefly introduced. Apparently, the drawings described hereinafter are merely for some embodiments of the present disclosure and the ordinary skilled in the art can obtain other drawings based on the described drawings without paying creative efforts.

DETAILED DESCRIPTION OF THE EMBODIMENTS

Specific implementations of the present disclosure are further described hereinafter in conjunction with drawings and embodiments. The following embodiments merely intend to illustrate the present disclosure rather than to limit the scope of the present disclosure.

To further clarify objectives, technical solutions and advantages of the embodiments of the present disclosure, the technical solutions of the embodiments of the present disclosure are described clearly and completely hereinafter in conjunction with the drawings used in the embodiments of the present disclosure. Apparently, the described embodiments are only a part of embodiments of the present disclosure rather than all the embodiments. Other embodiments obtained by the ordinary skilled in the art based on the described embodiments of the present disclosure all fall in the scope of protection of the present disclosure.

Unless specific definitions are further given, technical terms or scientific terms used herein refer to normal meanings which can be understood by ordinary skilled in the field to which the present disclosure relates. Terms such as "first" and "second" used in the specification and the list of claims of the present disclosure do not indicate any order, numbers or differences in importance, and are merely used to distinguish different components. Similarly, terms such as "one" or "an" represent there exist at least one, rather than to limit the number. Terms such as "connected with" or "connected to" do not limit to physical or mechanical connections, and can include electrical connections which may be direct or indirect. Terms of "above", "below", "left", and "right" are merely used to describe a relative position relationship; if the absolute position of one described object alters, the relative position relationship of the described object alters correspondingly.

Principle and characteristics of the disclosure are described hereinafter in conjunction with the drawings, and used examples merely intend to explain the present disclosure rather than to limit the scope of the present disclosure.

When using an ink jet printing apparatus in the conventional technology to manufacture an OLED device, since solvents in a dummy region of a substrate and in a center region of the substrate have different volatilization speeds during a printing process, the dummy region of the substrate dries quickly and generates mura, thereby adversely influencing the display effect. An ink jet printing apparatus is provided in the present disclosure, which can alleviate the phenomenon that the solvent in the dummy region of the substrate volatizes too quickly and can improve the uniformity of a film formed on the substrate.

Figure 1:
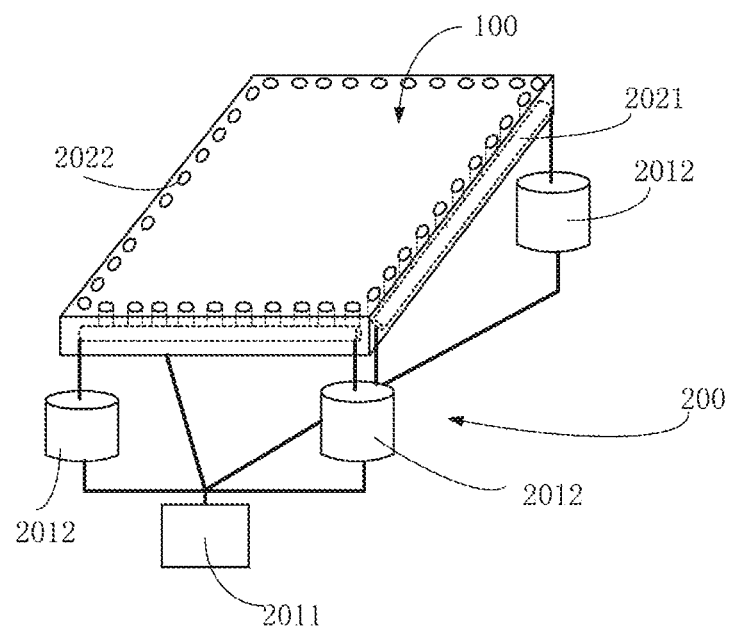
FIG. 1 is schematic structural view of an ink jet printing apparatus according to an embodiment of the present disclosure.
Figure 2:
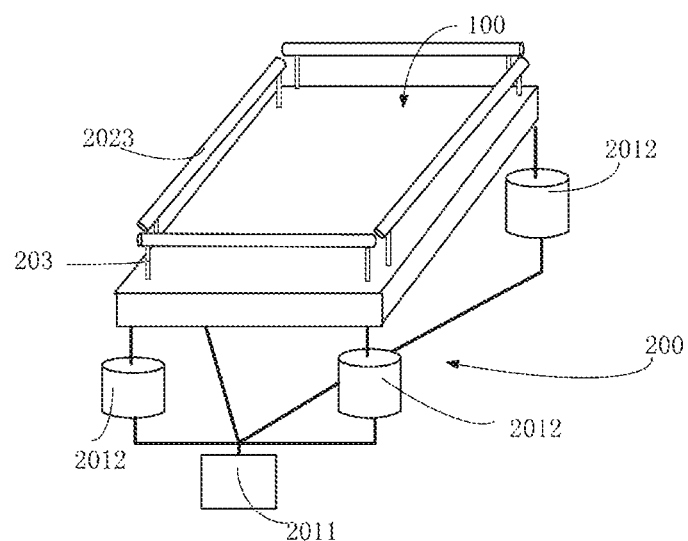
FIG. 2 is schematic structural view of an ink jet printing apparatus according to another embodiment of the present disclosure.

FIG. 1 and FIG. 2 illustrate an ink jet printing apparatus, which is provided in the present disclosure and is for jetting an ink onto a to-be-processed substrate to perform printing.

The ink jet printing apparatus includes:
a support base 100, which is for supporting the to-be-processed substrate; and
a solvent adjusting mechanism 200, which is for supplying a dummy region of the to-be-processed substrate on the support base 100 with a first solvent that includes a same material as a solvent in the ink and adjusting a solvent atmosphere of the dummy region of the to-be-processed substrate on the support base 100, to make the solvent atmosphere of the dummy region of the to-be-processed substrate and a solvent atmosphere of a center region of the to-be-processed substrate reach a predetermined condition; where the solvent adjusting mechanism 200 is arranged on the support base 100.

During the printing process performed by the ink jet printing apparatus in the conventional technology, the volatilization speed of the solvent in the dummy region of the to-be-processed substrate is quicker than that of the solvent in the center region of the to-be-processed substrate. In the ink jet printing apparatus provided in the present disclosure, the solvent adjusting mechanism 200 is arranged to supply the dummy region of the to-be-processed substrate on the support base 100 with the first solvent that is the same as the solvent in the ink, to make the solvent atmosphere of the dummy region of the to-be-processed substrate and the solvent atmosphere of the center region of the to-be-processed substrate to be roughly similar or to reach predetermined other condition. Hence, the volatilization speed of the solvent in the dummy region of the to-be-processed substrate is roughly similar to that of the solvent in the center region of the to-be-processed substrate, which alleviates the phenomenon that the solvent in the dummy region of the to-be-processed substrate volatizes too quickly, thereby avoiding the generation of mura in the dummy region of the substrate, improving the uniformity of a formed film and enhancing the display quality.

According to an embodiment of the present disclosure, the solvent adjusting mechanism 200 includes a first adjusting mechanism, which is for supplying the dummy region of the to-be-processed substrate on the support base 100 with the first solvent in a form of gas.

Based on the above-described solution, in the present disclosure, the solvent adjusting mechanism 200 directly supplies the support base 100 with the first solvent (i.e., the solvent in the ink for printing) in the form of gas. The first solvent in the form of gas can directly generate a solvent atmosphere in the dummy region of the to-be-processed substrate which is roughly similar to that in the center region, such that the volatilization speeds of the solvents in the ink in the dummy region and the center region of the substrate are roughly similar to each other. In addition, the first solvent in the form of gas may not cause adverse effects on the ink in the dummy region of the substrate, and accordingly, the product is ensured with good quality.

Obviously it can be understood that, in practical applications, the solvent adjusting mechanism 200 may further include a second adjusting mechanism, which is for supplying the dummy region of the to-be-processed substrate on the support base 100 with the first solvent in a form of liquid.

That is, the solvent adjusting mechanism 200 may supply the dummy region of the to-be-processed substrate on the support base 100 with the first solvent in the form of liquid. Alternatively, the solvent adjusting mechanism 200 may supply the dummy region of the to-be-processed substrate on the support base 100 with both the first solvent in the form of gas and the first solvent in the form of liquid.

It should be noted that, when directly supplying the dummy region of the to-be-processed substrate with the first solvent in the form of liquid, it needs to be ensured that the solvent in the form of liquid may not cause adverse effects on the ink and high process requirements are needed for the approach of supplying the first solvent in the form of liquid. Hence, in optional embodiments of the present disclosure, the solvent adjusting mechanism 200 is preferred to supply the support base 100 with the first solvent in the form of gas. However, for requirements of some specific processes in actual production, the solvent atmosphere of the dummy region of the to-be-processed substrate on the support base 100 can be adjusted by supplying the dummy region of the to-be-processed substrate on the support base 100 with the first solvent in the form of liquid, such that the solvent atmosphere of the dummy region of the to-be-processed substrate and the solvent atmosphere of the center region of the to-be-processed substrate reach some predetermined conditions.

In an embodiment of the present disclosure, for example, the first adjusting mechanism includes a gaseous solvent supplying device for supplying the first solvent in the form of gas, and a gaseous solvent discharging device for guiding and discharging the first solvent in the form of gas to the dummy region of the to-be-processed substrate on the support base 100. The gaseous solvent discharging device is in communication with the gaseous solvent supplying device and is arranged at a periphery position of the support base 100.

Based on the above-described solution, the gaseous solvent supplying device of the first adjusting mechanism is for supplying the first solvent in the form of gas, and the gaseous solvent discharging device is for guiding and discharging the first solvent in the form of gas to positions of the support base, where the positions correspond to the dummy region of the to-be-processed substrate. Hence, the first solvent (i.e., the solvent in the ink) in the form of gas is supplied to the dummy region of the to-be-processed substrate during the printing process.

Optional implementations of the gaseous solvent supplying device are provided hereinafter. As shown in FIG. 1 and FIG. 2, the gaseous solvent supplying device includes:

a liquid supplying device 2011, which is for supplying the first solvent in the form of liquid; and a solvent volatizing device 2012, which is for converting the first solvent from liquid to gas, where the solvent volatizing device 2012 is in communication with both the liquid supplying device 2011 and the gaseous solvent discharging device.

In the above-described scheme, a gaseous solvent is converted from the first solvent in the form of liquid by the solvent volatizing device 2012. The solvent volatizing device 2012 may convert a liquid solvent into the gaseous solvent with approaches of ultrasound or thermal evaporation.

Apparently it can be understood that, in actual applications, the gaseous solvent supplying device can include a material supplying device which directly stores the first solvent in the form of gas therein.

It should be noted that, compared with directly supplying the first solvent in the form of gas, volatizing the first solvent in the form of liquid to obtain the gaseous solvent and then supplying the gaseous solvent to the dummy region of the to-be-processed substrate, which are provided in a preferred embodiment of the disclosure, have the following advantages. The first solvent in the form of liquid is easier to store and obtain than the first solvent in the form of gas. In addition, the solvent in the ink for printing is in the form of liquid, if the first solvent in the form of gas is converted from the first solvent in the form of liquid, the solvent in the ink and the first solvent in the form of liquid in the liquid supplying device 2011 can be produced in the same batch in practical applications. That is, it is easier to ensure that the solvent in the ink is same as the first solvent in the form of liquid, and an OLED device manufactured through ink jet printing is further ensured with a good product quality.

Furthermore, in an embodiment of the present disclosure, the gaseous solvent supplying device further includes a control device, which is for controlling a supplying condition of the first solvent in the form of gas. The supplying condition includes a supplying dose of the first solvent in the form of gas.

Based on the above-described scheme, the supplying dose of the first solvent in the form of gas can be controlled with the arrangement of the control device, such that the ink jet printing apparatus is easier to obtain ideal solvent atmosphere through adjustment.

For example, different inks and different solvents are used for different OLED products. In order to make the solvent atmosphere in the dummy region of the to-be-processed substrate and the solvent atmosphere in the center region of the to-be-processed substrate roughly the same, different doses of gaseous solvent may be required for different OLED products. The supplying dose of the first solvent in the form of gas can be controlled by controlling the supplying condition of the first solvent in the form of gas in the dummy region of the to-be-processed substrate by the control device, thereby meeting different requirements.

In addition, it should be noted that, the supplying condition may further include an ON/OFF state of the first solvent in the form of gas. That is, the control device can control whether the first solvent in the form of gas is supplied or not; when the printing starts, the control device controls the gaseous solvent supplying device to supply the first solvent in the form of gas; and when the printing finishes, the control device controls the gaseous solvent supplying device to stop supplying the first solvent in the form of gas.

Obviously it can be understood that, the supplying condition may further include other supplying parameters of the first solvent in the form of gas, for example, the density of the first solvent in the form of gas.

Optionally, the control device includes a first control mechanism, which is for controlling an operating state of the solvent volatizing device 2012 to control the dose of the first solvent in the form of gas converted from the first solvent in the form of liquid. The first control mechanism is connected with the solvent volatizing device 2012.

Based on the above-described scheme, the operating state of the solvent volatizing device 2012 can be controlled by the first control mechanism; that is, an volatilization extent of the first solvent in the form of liquid can be controlled by controlling the solvent volatizing device 2012, thereby controlling the supplying dose of the first solvent in the form of gas.

Obviously it can be understood that, in practical applications, the control device may have other structures. For example, a control valve can be arranged at a connection pipe between the solvent volatizing device 2012 and the gaseous solvent discharging device, and the supplying dose of the first solvent in the form of gas can be controlled by the control valve.

In addition, according to an embodiment of the present disclosure, optionally, as shown in FIG. 1 and FIG. 2, the gaseous solvent discharging device includes:

supplying passages 2021 arranged surrounding a periphery of the support base 100, where the supplying passages 2021 are in communication with the gaseous solvent supplying device; and multiple gas jetting holes 2022, which are distributed on the supplying passages 2021 and are for jetting the first solvent in the form of gas to the periphery of the support base 100.

Based on the above-described scheme, the supplying passages 2021 are in communication with the gaseous solvent supplying device and are for collecting the first solvent in the form of gas in the gaseous solvent supplying device. The gas jetting holes 2022 are arranged on the supplying passages 2021, and can discharge the first solvent in the form of gas in the supplying passages 2021 to the periphery of the support base 100.

It should be noted that, in the above scheme, the supplying passages 2021 may have many kinds of specific structures. For example, as shown in FIG. 1, the supplying passages 2021 may be pipes arranged inside the support base 100, below a supporting surface of the support base 100, and along the periphery of the support base 100. Alternatively, as shown in FIG. 2, the supplying passages 2021 may be gas jet rods 2023 arranged above the supporting surface of the support base 100 and along the periphery of the support base 100. Specific structures of the supplying passages 2021 are not enumerated herein.

In addition, in the printing process performed by the ink jet printing apparatus in the conventional technology, in the dummy region of the to-be-processed substrate on the support base 100, positions close to four corners dry quickly and positions close to the center dry slowly. Hence, in an optional embodiment of the present disclosure, the solvent atmospheres at the four corners of the to-be-processed substrate are compensated, thereby further improving the uniformity of a formed film and reducing generation of mura.

Specifically, as shown in FIG. 1 and FIG. 2, the supplying passages 2021 include four pipe segments surrounding the periphery of the support base 100. Ends of each pipe segment are gas inlets, and the gas inlets are arranged at positions corresponding to the four corners of the to-be-processed substrate on the support base 100. With this scheme, by arranging the gas inlets of the supplying passages 2021 on the positions corresponding to the four corners of the to-be-processed substrate, supplying doses of the first solvent in the form of gas at the positions corresponding to the four corners of the to-be-processed substrate are larger than supplying doses at other positions, thereby compensating the solvent atmospheres at positions of the four corners of the to-be-processed substrate.

In addition, in other embodiments of the present disclosure, gas flow amounts of gas jetting holes 2022 arranged at positions corresponding to the four corners of the to-be-processed substrate on the support base 100 may be set larger than gas flow amounts of gas jetting holes 2022 arranged at positions corresponding to other positions of the to-be-processed substrate on the support base 100 other than the four corners, to compensate the solvent atmospheres at positions of the four corners of the to-be-processed substrate. It is understood that, in practical applications, other ways for compensating the solvent atmospheres at positions of the four corners of the to-be-processed substrate, which will not be enumerated herein.

Figure 3:
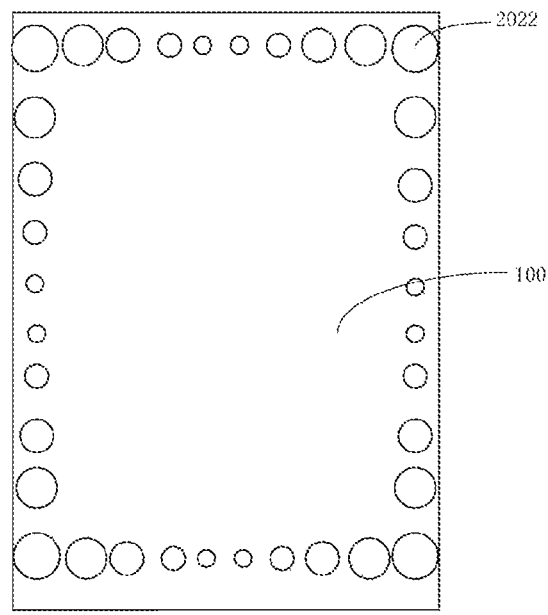
FIG. 3 is a schematic view showing a distribution way of respective gas jetting holes in an ink jet printing apparatus provided in the present disclosure.
Figure 4:
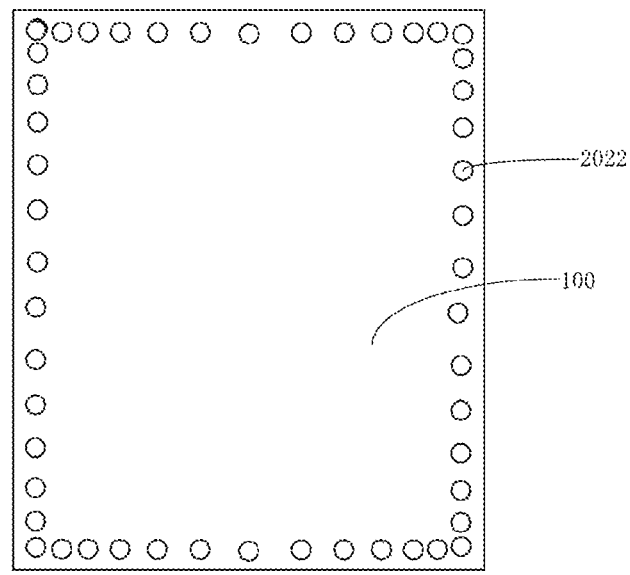
FIG. 4 is a schematic view showing another distribution way of respective gas jetting holes in an ink jet printing apparatus provided in the present disclosure.

Furthermore, in the above scheme, diameters and the quantity of the gas jetting holes 2022 can be designed, to make the gas flow amounts of gas jetting holes 2022 arranged at positions corresponding to the four corners of the to-be-processed substrate larger than the gas flow amounts of gas jetting holes 2022 arranged at other positions. Specifically, as shown in FIG. 3, diameters of gas jetting holes 2022 arranged at positions corresponding to the four corners of the to-be-processed substrate on the support base 100 are larger than diameters of gas jetting holes 2022 arranged at other positions. Alternatively, as shown in FIG. 4, quantities (or distribution densities) of gas jetting holes 2022 arranged at positions corresponding to the four corners of the to-be-processed substrate on the support base 100 are larger than quantities (or distribution densities) of gas jetting holes 2022 arranged at other positions.

Furthermore, as shown in FIG. 3, from a position corresponding to one corner of the to-be-processed substrate to a position corresponding to another corner adjacent to the one corner of the to-be-processed substrate, diameters of the gas jetting holes 2022 first gradually decrease and then gradually increase. Alternatively, as shown in FIG. 4, from a position corresponding to one corner of the to-be-processed substrate to a position corresponding to another corner adjacent to the one corner of the to-be-processed substrate, quantities of the gas jetting holes 2022 first gradually decrease and then gradually increase. Based on the above-described further scheme, compensation can be made to positions of the four corners of the to-be-processed substrate according to a gradient rule, which is advantageous for the uniformity of a formed film.

Obviously it can be understood that, approaches for controlling the gas flow amounts of the gas jetting holes 2022 are not limited to the approaches given above. In practical applications, other approaches can be used and are not enumerated herein.

In addition, in an embodiment of the present disclosure, the gas jetting holes 2022 may have various structures. Optionally, a jetting direction of the first solvent in the form of gas out of the gas jetting holes 2022 is substantially perpendicular to the supporting surface of the support base 100. Alternatively, a jetting direction of the first solvent in the form of gas out of the gas jetting holes 2022 is slant towards a center portion of the support base 100. On one hand, designing the gas jetting holes 2022 with the structure that the jetting direction of the first solvent in the form of gas out of the gas jetting holes 2022 is substantially perpendicular to the supporting surface of the support base 100 is more applicable to a support base 100 having a relative small size. On the other hand, designing the gas jetting holes 2022 with the structure that the jetting direction of the first solvent in the form of gas out of the gas jetting holes 2022 is slant towards the center portion of the support base 100 is more applicable to a support base 100 having a relative large size. It should be understood that, specific structures of the gas jetting holes 2022 are not limited herein.

In addition, in an embodiment of the present disclosure, optionally, as shown in FIG. 2, the gaseous solvent discharging device may further include a moving device, which is for moving the supplying passages 2021 to adjust positions of the gas jetting holes 2022 with respect to the supporting surface of the support base 100. With the scheme, the positions of the gas jetting holes 2022 with respect to the support base 100 can be adjusted by the moving device, such that the ink jet printing apparatus is more applicable to various sizes of substrate and it is easier to adjust the solvent atmosphere to an ideal condition.

Specific implementations of moving the supplying passages 2021 by the moving device are explained hereinafter.

As shown in FIG. 1 and FIG. 2, four gas jet rods 2023 are surrounding the periphery of the support base 100. Obviously, it is understood by those skilled in the art that the quantity of the gas jet rods 2023 is not limited to four and can be selected as other numbers according to actual needs. The gas jet rods 2023 are hollowed inside and form the supplying passages 2021, and the gas jetting holes 2022 are distributed on the gas jet rods 2023. Specifically, the moving device includes a first moving structure, which is for moving the gas jet rods 2023 in a first direction substantially perpendicular to the supporting surface of the support base 100. One end of the first moving structure is connected to the gas jet rods 2023, and the other end of the first moving structure is connected to the support base 100.

Based on the above-described scheme, the supplying passages 2021 are formed by the four gas jet rods 2023, and the positions of the gas jetting holes 2022 with respect to the supporting surface of the support base 100 are adjusted through moving the gas jet rods 2023 by the first moving structure of the moving device, the structure is simple and the operation is easy. It should be understood that, according to other embodiments of the present disclosure, the gas jet rods 2023 can be replaced by other structures and the disclosure is not limit in this aspect.

Furthermore, in an embodiment of the present disclosure, as shown in FIG. 2, the first moving structure includes a telescopic rod 203 having one end connected to the gas jet rods 2023 and another end connected to the support base 100. With the scheme, the gas jet rods 2023 can be raised up and lowered down through the telescopic rod 203 and distances from the gas jetting holes 2022 to the supporting surface of the support base 100 can be adjusted, the structure is simple and the operation is easy. Specifically, the telescopic rod 203 can be implemented as a hydraulic rod. Obviously it can be understood that, only one implementation of the first moving structure is provided herein, while the first moving structure can be achieved with other implementations in actual applications.

Furthermore, in an embodiment of the present disclosure, the telescopic rod 203 is hollowed inside and is in communication with the gas jet rods 2023 and the gaseous solvent supplying device. With the scheme, the gas jet rods 2023 and the gaseous solvent supplying device are communicated through the telescopic rod 203, which simplifies the structure. Specifically, one end of the telescopic rod 203 can be inserted into the support base 100, the gaseous solvent supplying device can extend into the support base 100 through a pipe and can be in communication with the telescopic rod 203, the other end of the telescopic rod 203 is inserted into the gas jet rods 2023 and is in communication with the gas jet rods 2023.

It should be noted that, in actual applications, the gas jet rods 2023 and the gaseous solvent supplying device can be communicated with each other with other approaches. For example, the gas jet rods 2023 can be communicated with the gaseous solvent supplying device directly through a flexible pipe.

In addition, it should be further noted that, the moving device may further include a second moving structure, which is for moving the gas jet rods 2023 in a direction substantially perpendicular to the first direction. With the scheme, the gas jet rods 2023 can be moved in the direction substantially perpendicular to the first direction through the arrangement of the second moving structure, thereby adjusting the positions of the gas jetting holes 2022 with respect to the support base 100.

It should be noted that, specific structure of the second moving structure may have many implementations. For example, the second moving structure may include a rail surrounding the periphery of the support base 100 and a moving component which can moves along the rail. The moving component is connected to the gas jet rods 2023 and causes the gas jet rods 2023 to move in the direction substantially perpendicular to the first direction.

In addition, a display substrate is provided according to an embodiment of the present disclosure. The display substrate is manufactured by the foregoing ink jet printing apparatus. The display substrate is very applicable to manufacturing of substrates in OLED display devices. Correspondingly, a solvent atmosphere in a dummy region of the substrate is roughly similar to or slightly differs from a solvent atmosphere in a center region of the substrate, thereby alleviating the phenomenon that the solvent in the dummy region of the substrate volatizes quickly and improving the uniformity of a formed film.

In addition, an ink jet printing method is further provided according to an embodiment of the present disclosure. The ink jet printing method is for jetting an ink onto a to-be-processed substrate to perform printing.

The ink jet printing method includes:
supporting the to-be-processed substrate by a support base 100; and
supplying a dummy region of the to-be-processed substrate on the support base 100 with a first solvent that is same as a solvent in the ink and adjusting a solvent atmosphere of the dummy region of the to-be-processed substrate on the support base 100, by a solvent adjusting mechanism 200 arranged on the support base 100, to make the solvent atmosphere of the dummy region of the to-be-processed substrate and a solvent atmosphere of a center region of the to-be-processed substrate reach a predetermined condition.

Correspondingly, in the substrate manufactured by the ink jet printing method, the solvent atmosphere of the dummy region is roughly similar to or slightly differs from the solvent atmosphere of the center region, thereby alleviating the phenomenon that the solvent in the dummy region of the substrate volatizes quickly and improving the uniformity of a formed film.

The above-described embodiments are merely preferred embodiments of the present disclosure. It should be noted that, the ordinary skilled in the art can make various modifications and polishment without departing from the principle of the present disclosure, and all these modifications and polishment shall fall within the scope of protection of the present disclosure.

What is claimed is:

1. An inkjet printing apparatus, for jetting ink onto a to-be-processed substrate to perform printing, comprising:
a support base, configured to support the to-be-processed substrate; and
a solvent adjusting mechanism, configured to supply a dummy region of the to-be-processed substrate on the support base with a first solvent that is same as a solvent in the ink and adjust a solvent atmosphere of the dummy region of the to-be-processed substrate on the support base, to make the solvent atmosphere of the dummy region of the to-be-processed substrate and a solvent atmosphere of a center region of the to-be-processed substrate reach a predetermined condition; wherein the solvent adjusting mechanism is arranged on the support base,
the solvent adjusting mechanism comprises a first adjusting mechanism configured to supply the dummy region of the to-be-processed substrate on the support base with the first solvent in the form of gas,
the first adjusting mechanism comprises a gaseous solvent supplying device configured to supply the first solvent in the form of as and a gaseous solvent discharging device configured to guide and discharge the first solvent in the form of gas to the dummy region of the to-be-processed substrate on the support base; wherein the gaseous solvent discharging device is in communication with the gaseous solvent supplying device and is arranged at a periphery of the support base,
the gaseous solvent discharging device comprises supplying passages surrounding a periphery of the support base, the supplying passages being in communication with the gaseous solvent supplying device; and a plurality of gas jetting holes, distributed on the supplying passages and configured to let the first solvent in the form of gas to the periphery of the support base, and
gas flow amounts of as jetting holes arranged at positions corresponding to four corners of the to-be-processed substrate on the support base are larger than gas flow amounts of gas jetting holes arranged at positions corresponding to other positions of the to-be-processed substrate on the support base other than the four corners.

2. The ink jet printing apparatus according to claim 1, wherein:
the predetermined condition comprises a condition that the solvent atmosphere of the dummy region of the to-be-processed substrate is approximately same as the solvent atmosphere of the center region of the to-be-processed substrate.

3. The inkjet printing apparatus according to claim 1, wherein the gaseous solvent supplying device comprises:
a liquid supplying device configured to supply the first solvent in the form of liquid; and
a solvent volatizing device configured to convert the first solvent from liquid to gas, wherein the solvent volatizing device is in communication with both the liquid supplying device and the gaseous solvent discharging device.

4. The inkjet printing apparatus according to claim 3, wherein the gaseous solvent supplying device further comprises a control device configured to control a supplying condition of the first solvent in the form of gas; wherein the supplying condition comprises a supplying dose of the first solvent in the form of gas.

5. The inkjet printing apparatus according to claim 4, wherein the control device comprises a first control mechanism, configured to control an operating state of the solvent volatizing device to control a dose of the first solvent in the form of gas converted from the first solvent in the form of liquid; wherein the first control mechanism is connected with the solvent volatizing device.

6. The inkjet printing apparatus according to claim 1, wherein the supplying passages comprise four pipe segments surrounding the periphery of the support base, gas inlets are provided at ends of each pipe segment, and the gas inlets are arranged at positions corresponding to four corners of the to-be-processed substrate on the support base.

7. The inkjet printing apparatus according to claim 1, wherein a jetting direction of the first solvent in the form of gas out of the gas jetting holes is substantially perpendicular to a supporting surface of the support base.

8. The inkjet printing apparatus according to claim 1, wherein a jetting direction of the first solvent in the form of gas out of the gas jetting holes is slant towards a center portion of the support base.

9. The inkjet printing apparatus according to claim 1, wherein the gaseous solvent discharging device further comprises a moving device, configured to move the supplying passages to adjust positions of the gas jetting holes with respect to a supporting surface of the support base.

10. The inkjet printing apparatus according to claim 9, wherein four gas jetting rods are arranged at the periphery of the support base, the gas jetting rods are hollowed inside to form the supplying passages, and the gas jetting holes are distributed on the gas jetting rods;
wherein the moving device comprises a first moving structure, configured to move the gas jetting rods in a first direction substantially perpendicular to the supporting surface of the support base, one end of the first moving structure is connected to the gas jetting rods, and another end of the first moving structure is connected to the support base.

11. The inkjet printing apparatus according to claim 10, wherein the first moving structure comprises a telescopic rod having one end connected to the gas jetting rods and another end connected to the support base.

12. The inkjet printing apparatus according to claim 11, wherein the telescopic rod is hollowed inside and is in communication with the gas jetting rods and the gaseous solvent supplying device.

13. The inkjet printing apparatus according to claim 11, wherein the telescopic rod is a hydraulic rod.

14. The ink jet printing apparatus according to claim 1, wherein diameters of the gas jetting holes arranged at positions corresponding to four corners of the to-be-processed substrate on the support base are larger than diameters of the gas jetting holes arranged at the other positions; or
quantities or distribution densities of the gas jetting holes arranged at positions corresponding to four corners of the to-be-processed substrate on the support base are larger than quantities or distribution densities of gas jetting holes arranged at the other positions.

15. The inkjet printing apparatus according to claim 1, wherein from a position corresponding to one corner of the to-be-processed substrate to a position corresponding to another corner adjacent to the one corner of the to-be-processed substrate, diameters of the gas jetting holes first gradually decrease and then gradually increase; or,
from a position corresponding to one corner of the to-be-processed substrate to a position corresponding to another corner adjacent to the one corner of the to-be-processed substrate, quantities of the gas jetting holes first gradually decrease and then gradually increase.

16. An inkjet printing apparatus, for jetting ink onto a to-be-processed substrate to perform printing, comprising:
a support base, configured to support the to-be-processed substrate; and
a solvent adjusting mechanism, configured to supply a dummy region of the to-be-processed substrate on the support base with a first solvent that is same as a solvent in the ink and adjust a solvent atmosphere of the dummy region of the to-be-processed substrate on the support base, to make the solvent atmosphere of the dummy region of the to-be-processed substrate and a solvent atmosphere of a center region of the to-be-processed substrate reach a predetermined condition;
wherein:
the solvent adjusting mechanism is arranged on the support base,
the solvent adjusting mechanism comprises a first adjusting mechanism configured to supply the dummy region of the to-be-processed substrate on the support base with the first solvent in the form of gas,
the first adjusting mechanism comprises a gaseous solvent supplying device configured to supply the first solvent in the form of gas and a gaseous solvent discharging device configured to guide and discharge the first solvent in the form of gas to the dummy region of the to-be-processed substrate on the support base; wherein the gaseous solvent discharging device is in communication with the gaseous solvent supplying device and is arranged at a periphery of the support base,
the gaseous solvent discharging device comprises supplying passages surrounding a periphery of the support base, the supplying passages being in communication with the gaseous solvent supplying device; and a plurality of gas jetting holes, distributed on the supplying passages and configured to jet the first solvent in the form of gas to the periphery of the support base, and the supplying passages comprise four pipe segments surrounding the periphery of the support base, gas inlets are provided at ends of each pipe segment, and the gas inlets are arranged at positions corresponding to four corners of the to-be-processed substrate on the support base.

17. The inkjet printing apparatus according to claim 16, wherein a jetting direction of the first solvent in the form of gas out of the gas jetting holes is substantially perpendicular to a supporting surface of the support base.

18. The inkjet printing apparatus according to claim 16, wherein a jetting direction of the first solvent in the form of gas out of the gas jetting holes is slanted towards a center portion of the support base.

19. The inkjet printing apparatus according to claim 16, wherein the gaseous solvent discharging device further comprises a moving device, configured to move the supplying passages to adjust positions of the gas jetting holes with respect to a supporting surface of the support base.

20. An inkjet printing method, for jetting ink onto a to-be-processed substrate to perform printing, comprising:
supporting the to-be-processed substrate by a support base; and
supplying a dummy region of the to-be-processed substrate on the support base with a first solvent that is same as a solvent in the ink and adjusting a solvent atmosphere of the dummy region of the to-be-processed substrate on the support base, by a solvent adjusting mechanism arranged on the support base, to make the solvent atmosphere of the dummy region of the to-be-processed substrate and a solvent atmosphere of a center region of the to-be-processed substrate reach a predetermined condition, wherein:
the solvent adjusting mechanism is arranged on the support base,
the solvent adjusting mechanism comprises a first adjusting mechanism configured to supply the dummy region of the to-be-processed substrate on the support base with the first solvent in the form of gas,
the first adjusting mechanism comprises a gaseous solvent supplying device configured to supply the first solvent in the form of as and a gaseous solvent discharging device configured to guide and discharge the first solvent in the form of gas to the dummy region of the to-be-processed substrate on the support base; wherein the gaseous solvent discharging device is in communication with the gaseous solvent supplying device and is arranged at a periphery of the support base,
the gaseous solvent discharging device comprises supplying passages surrounding a periphery of the support base, the supplying passages being in communication with the gaseous solvent supplying device; and a plurality of gas jetting holes, distributed on the supplying passages and configured to jet the first solvent in the form of as to the periphery of the support base, and
gas flow amounts of as jetting holes arranged at positions corresponding to four corners of the to-be-processed substrate on the support base are larger than gas flow amounts of gas jetting holes arranged at positions corresponding to other positions of the to-be-processed substrate on the support base other than the four corners.

\* \* \* \* \*